(12) United States Patent  
Tabuchi

(10) Patent No.: US 10,468,303 B2  
(45) Date of Patent: Nov. 5, 2019

(54) DEVICE CHIP MANUFACTURING METHOD

(71) Applicant: DISCO CORPORATION, Tokyo (JP)

(72) Inventor: Tomotaka Tabuchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/955,953

(22) Filed: Apr. 18, 2018

(65) Prior Publication Data

US 2018/0308755 A1   Oct. 25, 2018

(30) Foreign Application Priority Data

Apr. 19, 2017 (JP) ................................ 2017-082561

(51) Int. Cl.
| | |
|---|---|
| *H01L 21/304* | (2006.01) |
| *H01L 21/78* | (2006.01) |
| *H01L 21/3065* | (2006.01) |
| *H01L 21/683* | (2006.01) |

(52) U.S. Cl.
CPC .......... *H01L 21/78* (2013.01); *H01L 21/3043* (2013.01); *H01L 21/3065* (2013.01); *H01L 21/6836* (2013.01); *H01J 2237/334* (2013.01); *H01L 2221/68336* (2013.01)

(58) Field of Classification Search
CPC ... H01L 21/78; H01L 21/6836; H01L 21/304; H01L 21/308; H01L 21/268; H01L 21/67; H01L 21/311; H01L 21/677; H01L 21/683; H01L 21/3065; H01L 21/3083; H01L 21/31133; H01L 21/31144; H01L 21/67069; H01L 21/67742  
USPC .......................................................... 438/464  
See application file for complete search history.

(56) References Cited

U.S. PATENT DOCUMENTS

| | | | |
|---|---|---|---|
| 2015/0255349 A1* | 9/2015 | Holden | H01J 37/32009 438/462 |
| 2016/0071819 A1* | 3/2016 | Fuergut | H01L 21/30604 257/774 |
| 2018/0158713 A1* | 6/2018 | Okita | H01J 37/00 |

FOREIGN PATENT DOCUMENTS

| | | |
|---|---|---|
| JP | 2006114825 A | 4/2006 |
| JP | 2009187975 A | 8/2009 |

\* cited by examiner

*Primary Examiner* — Chuong A Luu  
(74) *Attorney, Agent, or Firm* — Greer, Burns & Crain, Ltd.

(57) ABSTRACT

A device chip manufacturing method includes a passivation film removing step of removing a passivation film along each division line, a wafer dividing step of performing plasma etching using a fluorine-based gas to the front side of a wafer in the condition where the passivation film is used as a mask, thereby dividing the wafer along the division lines, and a die attach film removing step of performing plasma etching using an oxygen-based gas to the front side of the wafer in the condition where the passivation film is used as a mask, thereby removing a part or the whole of a die attach film along each division line.

7 Claims, 5 Drawing Sheets

DEVICE CHIP MANUFACTURING METHOD

BACKGROUND OF THE INVENTION

Field of the Invention

The present invention relates to a device chip manufacturing method for processing a wafer having a plurality of devices formed on the front side to thereby manufacture a plurality of device chips corresponding to these plural devices.

Description of the Related Art

In manufacturing a plurality of device chips to be incorporated in various electronic equipment, a plurality of devices such as integrated circuits (ICs) are first formed on a wafer in a plurality of separate regions, in which these separate regions are defined by a plurality of crossing division lines (streets) set on the front side of the wafer. This wafer thus having the plural devices is cut along the division lines by using a cutting apparatus or a laser processing apparatus, for example, thereby obtaining the plural device chips corresponding to the plural devices.

In the device chip manufacturing method using the cutting apparatus as described above, the wafer is cut as being crushed by rotating a cutting blade, so that the device chips are apt to incur damage such as chipping and the die strength of each device chip also tends to lack. Further, since the cutting blade must be aligned with each division line in cutting the wafer, a relatively long period of time is required until the cutting of the wafer is finished.

In contrast thereto, in the device chip manufacturing method using the laser processing apparatus as described above, the wafer is cut without mechanical grinding or crushing, so that the occurrence of chipping or the like can be suppressed and the die strength of each device chip can also be improved. Furthermore, the width (kerf loss) required for cutting can be reduced. However, in this manufacturing method, the spacing between any adjacent ones of the device chips is small, so that there is a possibility that the adjacent device chips may come into contact with each other in transferring the wafer, causing the occurrence of chipping or the like.

In recent years, there has been proposed a device chip manufacturing method using plasma etching to cut a wafer (see Japanese Patent Laid-open No. 2006-114825 and Japanese Patent Laid-open No. 2009-187975, for example). In this manufacturing method, the wafer can be processed at a time by the plasma etching. Accordingly, even when the diameter of the wafer is increased or the size of each device (each device chip) is decreased, the time required for processing can be suppressed. Further, since the wafer is not mechanically cut, the occurrence of chipping or the like can be suppressed and the die strength of each device chip can also be improved.

SUMMARY OF THE INVENTION

In such a manufacturing method using plasma etching to cut a wafer, a resist mask must be formed on the wafer, so as to protect the device chips from a plasma. In general, the resist mask is formed by using photolithography or the like, which is a costly method. Accordingly, the price of each device chip cannot be suppressed in this manufacturing method. Further, plasma etching using a fluorine-based gas is frequently adopted in this manufacturing method. However, a die attach film (DAF) to be used in die bonding cannot be processed by this plasma etching. Accordingly, in the case that a die attach film is attached to the wafer, it is necessary to remove the die attach film along each division line by using a cutting apparatus or a laser processing apparatus separately from the plasma etching.

It is therefore an object of the present invention to provide a device chip manufacturing method which can manufacture a device chip with a die attach film attached thereto at a low cost.

In accordance with an aspect of the present invention, there is provided a device chip manufacturing method for processing a wafer to manufacture a plurality of device chips from the wafer, the wafer having a plurality of devices formed on the front side so as to be separated by a plurality of crossing division lines, a passivation film being formed on the front side of the wafer so as to cover the plurality of devices, the device chip manufacturing method including a passivation film removing step of removing the passivation film along each division line; a wafer supporting step of attaching a die attach film to the back side of the wafer and next attaching a dicing tape mounted on an annular frame to the die attach film to thereby support the wafer through the die attach film to the dicing tape; a wafer dividing step of performing plasma etching using a fluorine-based gas to the front side of the wafer in the condition where the passivation film is used as a mask after performing the passivation film removing step and the wafer supporting step, thereby dividing the wafer into the individual device chips along the division lines and exposing the die attach film along the division lines; and a die attach film removing step of performing plasma etching using an oxygen-based gas to the front side of the wafer in the condition where the passivation film is used as a mask after performing the wafer dividing step, thereby removing a part or the whole of the die attach film along each division line.

Preferably, the passivation film removing step includes the step of applying a laser beam having an absorption wavelength to the wafer along each division line to thereby form a groove on the front side of the wafer along each division line, so that the passivation film is removed along each division line. Preferably, the passivation film removing step includes the step of using a cutting blade to cut the passivation film along each division line, thereby forming a groove on the front side of the wafer along each division line, so that the passivation film is removed along each division line.

Preferably, the dicing tape is expandable. The device chip manufacturing method further includes a die attach film breaking step of expanding the dicing tape after performing the die attach film removing step, thereby breaking the die attach film along the division lines.

In the device chip manufacturing method according to the present invention, the passivation film formed on the front side of the wafer is removed along each division line, and the die attach film is attached to the back side of the wafer. Thereafter, the plasma etching using a fluorine-based gas is performed to the front side of the wafer in the condition where the passivation film is used as a mask. Thereafter, the plasma etching using an oxygen-based gas is performed to the front side of the wafer in the condition where the passivation film is used as a mask. Accordingly, it is unnecessary to form a resist mask as used in a conventional method. Further, the plasma etching using a fluorine-based gas is performed to remove the wafer along each division line, and the plasma etching using an oxygen-based gas is performed to remove a part of the die attach film along each division line. Accordingly, it is unnecessary to perform any separate method for removing the die attach film along each division line. Thus, by using the device chip manufacturing method according to the present invention, each device chip with the die attach film attached thereto can be manufactured at a low cost.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described with reference to the attached drawings. The device chip manufacturing method according to this preferred embodiment is a method of processing a wafer having a plurality of devices formed on the front side so as to be separated by a plurality of crossing division lines, thereby manufacturing a plurality of device chips corresponding to the plural devices. Further, a passivation film is previously formed on the front side of the wafer, so as to cover the plural devices. Accordingly, each device is protected by the passivation film.

More specifically, the passivation film covering the plural devices is first removed from the wafer along each division line (passivation film removing step). Further, a die attach film is attached to the back side of the wafer, and a dicing tape mounted on an annular frame is attached to the die attach film to thereby support the wafer through the die attach film to the dicing tape (wafer supporting step). Thereafter, plasma etching using a fluorine-based gas is performed to the front side of the wafer in the condition where the passivation film is used as a mask, thereby dividing the wafer into the individual device chips along the division lines and exposing the die attach film along the division lines (wafer dividing step). Thereafter, plasma etching using an oxygen-based gas is performed to the front side of the wafer in the condition where the passivation film is used as a mask, thereby removing a part or the whole of the die attach film along each division line (die attach film removing step). The device chip manufacturing method according to this preferred embodiment will now be described in more detail.

Figure 1A:
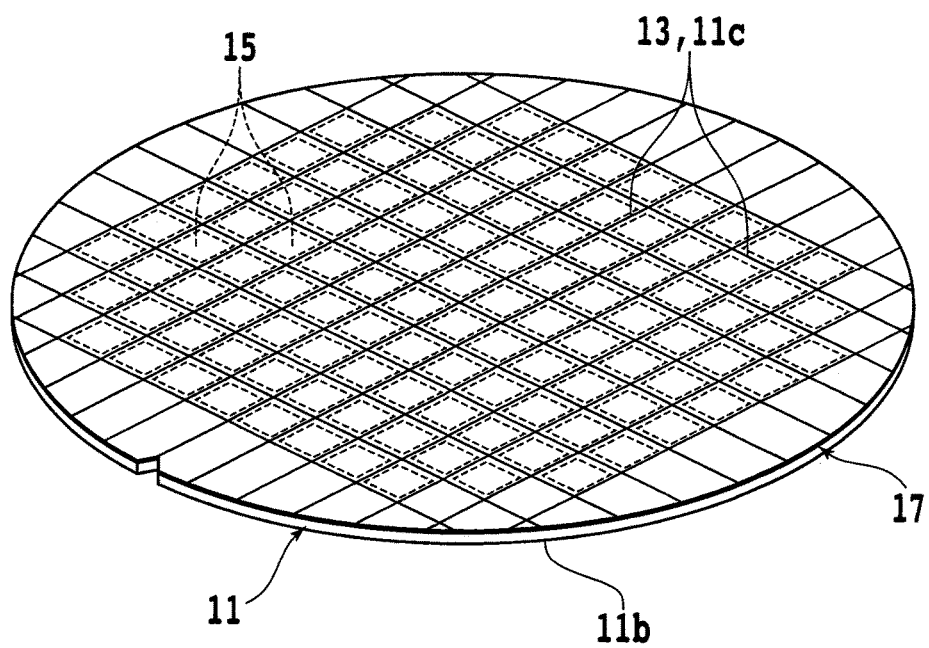
FIG. 1A is a schematic perspective view of a wafer processed by a passivation film removing step.
Figure 1B:
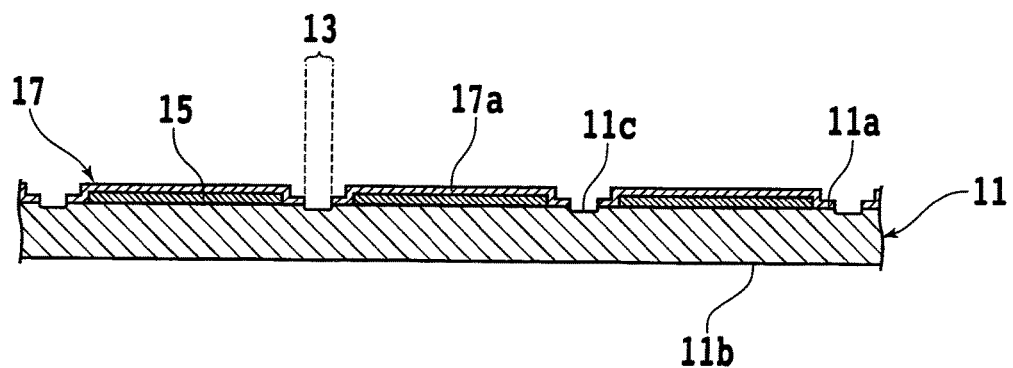
FIG. 1B is a schematic sectional view of the wafer shown in FIG. 1A.

In the device chip manufacturing method according to this preferred embodiment, the passivation film removing step is first performed to remove the passivation film covering the plural devices from the wafer along each division line. FIG. 1A is a schematic perspective view of a wafer 11 processed by the passivation film removing step, and FIG. 1B is a schematic sectional view of the wafer 11 shown in FIG. 1A. As shown in FIGS. 1A and 1B, the wafer 11 is a disk-shaped member formed of silicon (Si) or the like. The wafer 11 has a front side 11a and a back side 11b. A plurality of crossing division lines (streets) 13 are set on the front side 11a of the wafer 11 to thereby define a plurality of separate regions where a plurality of devices 15 such as integrated circuits (ICs) are formed.

Further, a passivation film 17 is previously formed on the front side 11a of the wafer 11 so as to fully cover the plural devices 15. Initially, each division line 13 is also covered with the passivation film 17. The passivation film 17 is formed of a material resistant to plasma etching using a fluorine-based gas and plasma etching using an oxygen-based gas to some extent, such as silicon oxide ($SiO_2$), silicon nitride (SiN), and silicon oxynitride ($SiO_xN_y$). The passivation film 17 is partially removed along each division line 13 by this passivation film removing step. As a result, a plurality of passivation films 17a each covering the respective plural devices 15 are present on the front side 11a of the wafer 11 at the time this passivation film removing step has been performed.

Figure 2A:
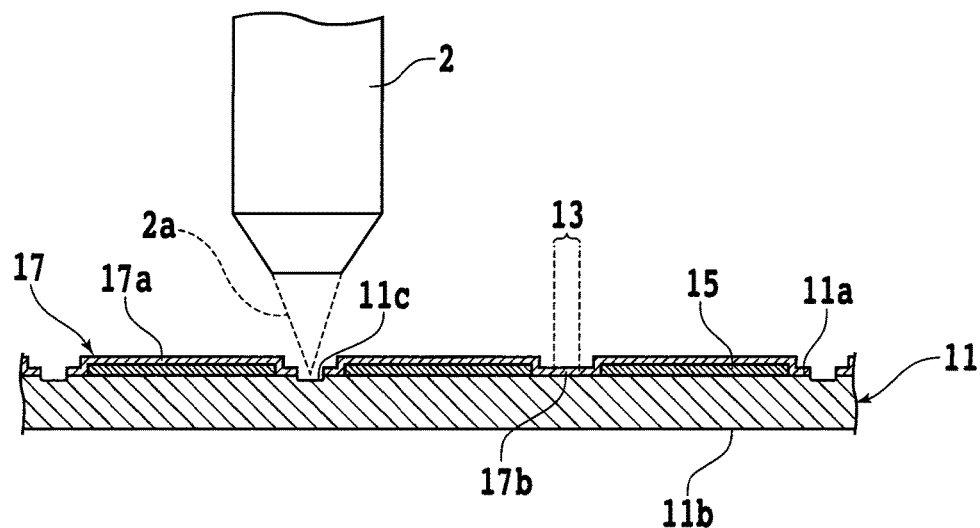
FIG. 2A is a sectional view for illustrating a first mode of the passivation film removing step.

FIG. 2A is a sectional view for illustrating a first mode of the passivation film removing step of removing the passivation film 17 along each division line 13. As shown in FIG. 2A, a laser beam 2a having an absorption wavelength to the wafer 11 is applied from a laser applying unit 2 located above the front side 11a of the wafer 11 in the first mode (ablation). More specifically, the laser beam 2a is applied along each division line 13 to thereby form a groove 11c on the front side 11a of the wafer 11 along each division line 13. Accordingly, a part 17b of the passivation film 17 along each division line 13 is removed by the laser beam 2a, and the passivation film 17a covering each device 15 is left.

Figure 2B:
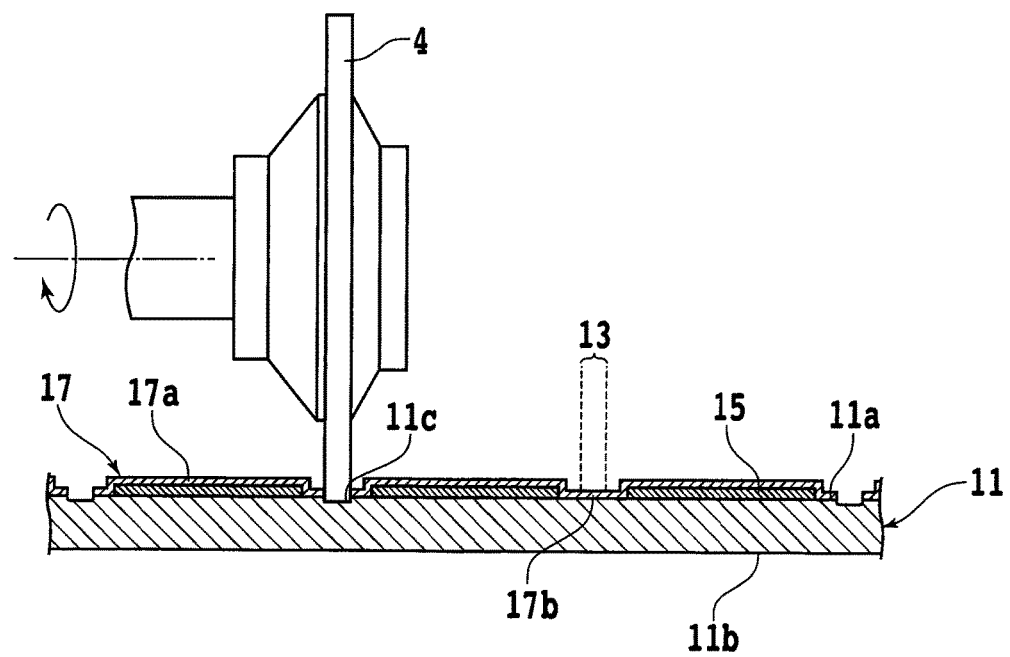
FIG. 2B is a sectional view for illustrating a second mode of the passivation film removing step.

FIG. 2B is a sectional view for illustrating a second mode of the passivation film removing step of removing the passivation film 17 along each division line 13. As shown in FIG. 2B, a cutting blade 4 is rotated and relatively fed along each division line 13 to cut the passivation film 17 along each division line 13, thereby forming a groove 11c on the front side 11a of the wafer 11 along each division line 13 in the second mode. Accordingly, a part 17b of the passivation film 17 along each division line 13 is removed by the cutting blade 4, and the passivation film 17a covering each device 15 is left.

While the wafer 11 is a disk-shaped member formed of silicon or the like in this preferred embodiment, the wafer 11 is not limited in material, shape, structure, size, etc. That is, it is only essential that the wafer 11 can be processed by plasma etching using a fluorine-based gas. Further, the passivation film 17 is also not limited in material, structure, thickness, etc. That is, it is only essential that the passivation film 17 must be resistant to plasma etching using a fluorine-based gas and plasma etching using an oxygen-based gas. Similarly, the devices 15 are not limited in kind, number, shape, structure, size, layout, etc.

Figure 3A:
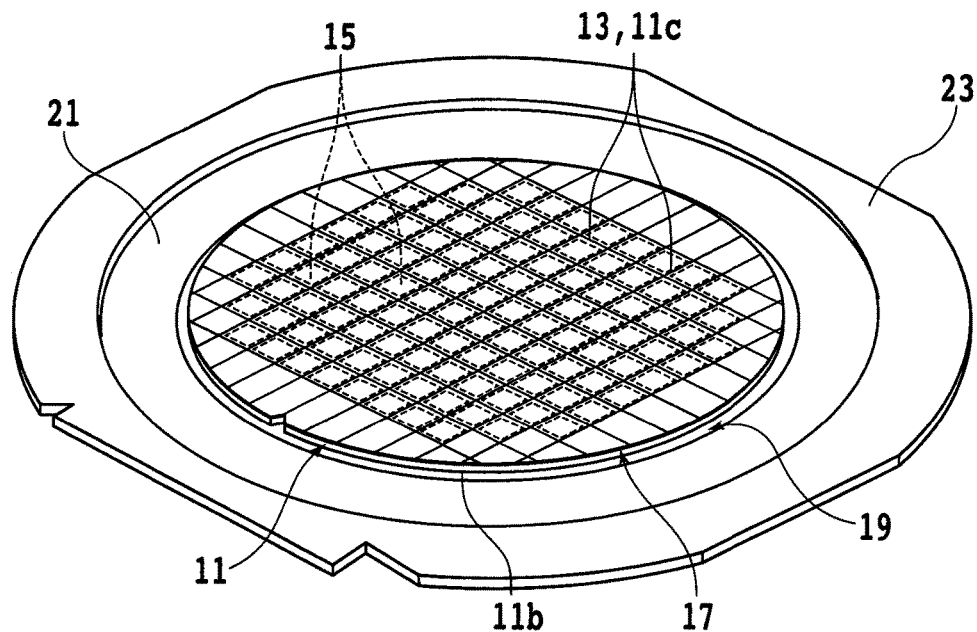
FIG. 3A is a perspective view for illustrating a wafer supporting step.
Figure 3B:
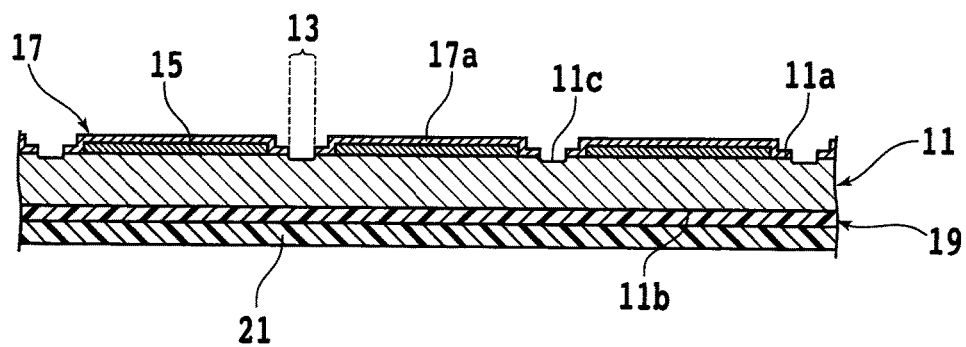
FIG. 3B is a sectional view for illustrating the wafer supporting step.

After performing the passivation film removing step, the wafer supporting step is performed to support the wafer to a dicing tape mounted on an annular frame. FIG. 3A is a perspective view for illustrating the wafer supporting step, and FIG. 3B is a sectional view for illustrating the wafer supporting step. In the wafer supporting step, a die attach film (DAF) 19 is first attached to the back side 11b of the wafer 11. For example, the die attach film 19 is a circular film having a diameter slightly larger than that of the wafer 11, and has predetermined adhesion. The die attach film 19 is formed by mainly using polyimide resin or epoxy resin. However, the die attach film 19 is not limited in material, shape, structure, size, etc.

Thereafter, a circular dicing tape 21 is attached at its central portion to the die attach film 19 attached to the back side 11b of the wafer 11. The dicing tape 21 has a diameter larger than that of the die attach film 19. Further, a peripheral portion of the dicing tape 21 is attached to an annular frame 23 so as to surround the wafer 11 and the die attach film 19. Accordingly, the wafer 11 is supported through the die attach film 19 to the dicing tape 21 mounted on the annular frame 23. While the wafer supporting step is performed after performing the passivation film removing step in this preferred embodiment, the wafer supporting step may be performed before performing the passivation film removing step.

Figure 4:
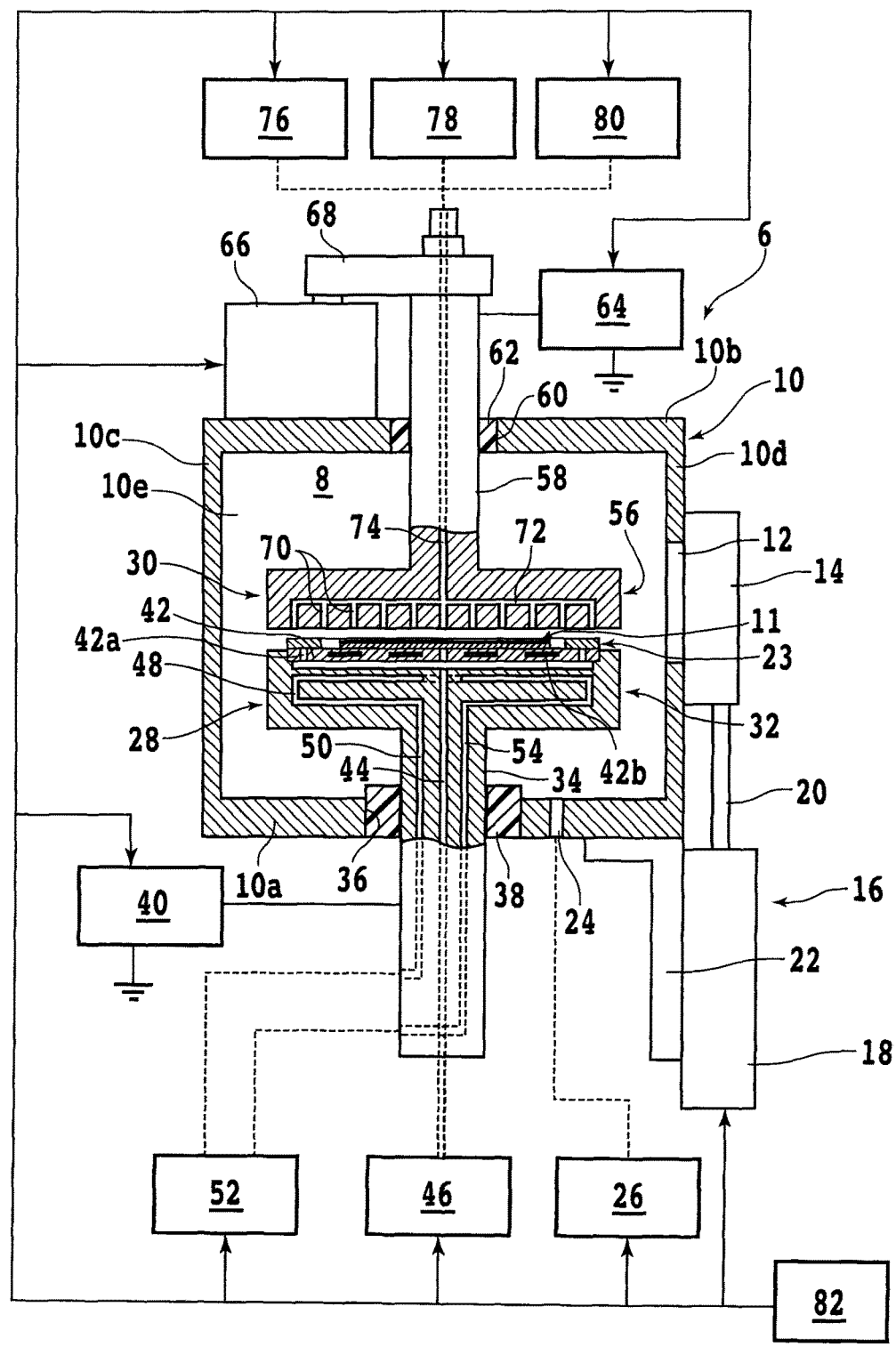
FIG. 4 is a partially sectional view schematically showing the configuration of a plasma etching apparatus for use in performing plasma etching.
Figure 5A:
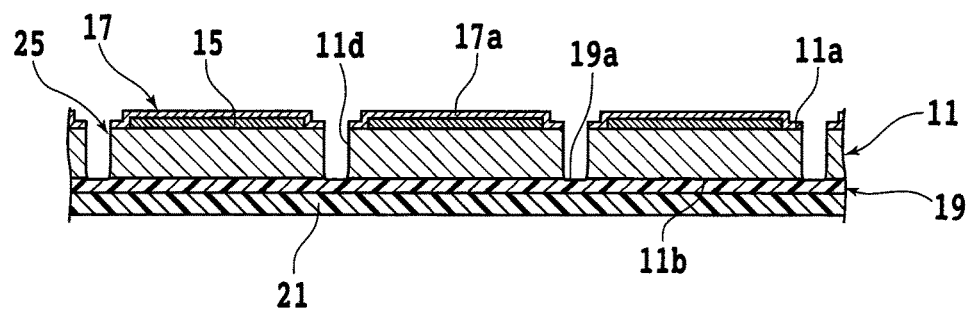
FIG. 5A is a sectional view for illustrating a wafer dividing step.

After performing the passivation film removing step and the wafer supporting step, the wafer dividing step is performed to divide the wafer 11 into the individual device chips along the division lines 13 by performing plasma etching using a fluorine-based gas. FIG. 4 is a partially sectional view schematically showing the configuration of a plasma etching apparatus 6 for use in performing the plasma etching. FIG. 5A is a sectional view for illustrating the wafer dividing step. In FIG. 4, some components are shown by functional blocks.

As shown in FIG. 4, the plasma etching apparatus 6 includes a vacuum chamber 10 defining a processing space 8. The vacuum chamber 10 is a boxlike member having a bottom wall 10a, a top wall 10b, a first side wall 10c, a second side wall 10d, a third side wall 10e, and a fourth side wall (not shown). The second side wall 10d is formed with an opening 12 as an inlet for loading the wafer 11 into the vacuum chamber 10 and as an outlet for unloading the wafer 11 out of the vacuum chamber 10. A gate 14 for closing the opening 12 is provided outside the opening 12. This gate 14 is vertically movable by a moving mechanism 16 located below the gate 14. The moving mechanism 16 includes an air cylinder 18 and a piston rod 20. The air cylinder 18 is fixed through a bracket 22 to the bottom wall 10a of the vacuum chamber 10. The front end (upper end) of the piston rod 20 is connected to the lower end of the gate 14. Accordingly, when the moving mechanism 16 is operated to open the gate 14, the wafer 11 can be loaded through the opening 12 into the processing space 8 of the vacuum chamber 10 or unloaded from the processing space 8 of the vacuum chamber 10 through the opening 12.

The bottom wall 10a of the vacuum chamber 10 is formed with an evacuation opening 24. The evacuation opening 24 is connected to an evacuating unit 26 such as a vacuum pump. A lower electrode 28 and an upper electrode 30 are provided in the processing space 8 of the vacuum chamber 10 so as to be opposed to each other. The lower electrode 28 is formed of a conductive material. The lower electrode 28 includes a disk-shaped holding portion 32 and a cylindrical supporting portion 34 extending downward from the center of the lower surface of the holding portion 32. The bottom wall 10a of the vacuum chamber 10 is formed with an opening 36, and the supporting portion 34 is inserted through the opening 36. An annular insulating member 38 is interposed between the bottom wall 10a and the supporting portion 34 in the opening 36, so as to insulate the vacuum chamber 10 and the lower electrode 28 from each other. The lower electrode 28 is connected to a radio frequency (RF) power source 40 at a position outside the vacuum chamber 10.

The upper surface of the holding portion 32 is formed with a recess, and an insulating table 42 for holding the wafer 11 is provided in this recess. The table 42 is formed with a suction passage 42a. Further, the lower electrode 28 is also formed with a suction passage 44. The suction passage 42a is connected through the suction passage 44 to a vacuum source 46. A plurality of electrodes 42b are embedded in the table 42. By supplying electric power to these electrodes 42b, electric force (typically, electrostatic attraction force) can be applied between each electrode 42b and the wafer 11 held on the table 42, thereby electrically holding the wafer 11 on the table 42. When the processing space 8 of the vacuum chamber 10 is evacuated, the wafer 11 cannot be held by the vacuum produced from the vacuum source 46. To cope with this problem, the electric force mentioned above is used to hold the wafer 11.

A cooling passage 48 is formed inside the holding portion 32. A coolant inlet passage 50 and a coolant outlet passage 54 are formed inside the supporting portion 34. One end of the cooling passage 48 is connected through the coolant inlet passage 50 to a coolant circulating unit 52, and the other end of the cooling passage 48 is connected through the coolant outlet passage 54 to the coolant circulating unit 52. Accordingly, when the coolant circulating unit 52 is operated, a coolant can be passed through the coolant inlet passage 50, the cooling passage 48, and the coolant outlet passage 54 in this order to thereby cool the lower electrode 28.

The upper electrode 30 is formed of a conductive material. The upper electrode 30 includes a disk-shaped gas discharge portion 56 and a cylindrical supporting portion 58 extending upward from the center of the upper surface of the gas discharge portion 56. The top wall 10b of the vacuum chamber 10 is formed with an opening 60, and the supporting portion 58 is inserted through the opening 60. An annular insulating member 62 is interposed between the top wall 10b and the supporting portion 58 in the opening 60, so as to insulate the vacuum chamber 10 and the upper electrode 30 from each other. The upper electrode 30 is connected to an RF power source 64 at a position outside the vacuum chamber 10. A support arm 68 is connected at one end portion thereof to an elevating mechanism 66. The other end portion of the support arm 68 is mounted to the upper end of the supporting portion 58. Accordingly, when the elevating mechanism 68 is operated to vertically move the support arm 68, the upper electrode 30 can be vertically moved. A plurality of discharge openings 70 are formed in the gas discharge portion 56 so as to open to the lower surface thereof. A gas supply passage 72 is formed in the gas discharge portion 56, and a gas supply passage 74 is formed in the supporting portion 58. The discharge openings 70 are connected through the gas supply passage 72 and the gas supply passage 74 to an $SF_6$ (fluorine-based gas) source 76, a $C_4F_8$ source 78, and an $O_2$ (oxygen-based gas) source 80. Thus, the $SF_6$ source 76, the $C_4F_8$ source 78, the $O_2$ source 80, the gas supply passages 72 and 74, and the discharge openings 70 constitute a gas introducing portion for introducing gases into the vacuum chamber 10.

All the moving mechanism 16, the evacuating unit 26, the RF power source 40, the vacuum source 46, the coolant circulating unit 52, the RF power source 64, the elevating mechanism 66, the $SF_6$ source 76, the $C_4F_8$ source 78, and the $O_2$ source 80 are connected to a control unit 82. For example, the control unit 82 receives information on the pressure in the processing space 8 from the evacuating unit 26. Further, the control unit 82 also receives information on the temperature of the coolant (i.e., information on the temperature of the lower electrode 28) from the coolant circulating unit 52. Further, the control unit 82 also receives information on the flow rate of each gas from the $SF_6$ source 76, the $C_4F_8$ source 78, and the $O_2$ source 80. According to these different kinds of information mentioned above and other information input from a user (operator), the control unit 82 outputs a control signal for controlling each component mentioned above.

In the wafer dividing step, the moving mechanism 16 is first operated to lower (open) the gate 14. Thereafter, the wafer 11 supported to the dicing tape 21 is loaded through the opening 12 into the processing space 8 of the vacuum chamber 10 and then placed on the table 42 of the lower electrode 28. More specifically, the wafer 11 is placed on the table 42 in the condition where the front side 11a of the wafer 11 is oriented upward. In loading the wafer 11, the elevating mechanism 66 is previously operated to raise the upper electrode 30. After placing the wafer 11 on the table 42, a vacuum produced from the vacuum source 46 is applied to the table 42. Furthermore, electric power is supplied to the electrodes 42b. Accordingly, the wafer 11 is fixed to the upper surface of the table 42. After fixing the wafer 11 to the table 42, the vacuum applied from the vacuum source 46 to the table 42 may be cut off.

Thereafter, the moving mechanism 16 is operated to raise (close) the gate 14, thereby enclosing the processing space 8. Further, the elevating mechanism 66 is operated to lower the upper electrode 30 so that a predetermined positional relation suitable for plasma etching is made between the upper electrode 30 and the lower electrode 28. Thereafter, the evacuating unit 26 is operated to evacuate the processing space 8. In this condition, the etching gas is supplied at a predetermined flow rate, and a predetermined RF power is supplied to the lower electrode 28 and the upper electrode 30, thereby generating a plasma including radicals and ions between the lower electrode 28 and the upper electrode 30. As a result, the front side 11a of the wafer 11 is exposed to this plasma in the area not covered with the passivation films 17a functioning as a mask.

In the wafer dividing step according to this preferred embodiment, an etching step, a protective film forming step, and a cleaning step are repeatedly performed to form a kerf (groove) 11d on the front side 11a of the wafer 11 along each division line 13, in which each kerf 11d has a depth reaching the back side 11b of the wafer 11 as shown in FIG. 5A.

In the etching step, $SF_6$ (fluorine-based gas) is supplied from the $SF_6$ source 76 at a predetermined flow rate (e.g., 1000 sccm), and a predetermined RF power is applied to the lower electrode 28 and the upper electrode 30 (e.g., 100 W to the lower electrode 28 and 2600 W to the upper electrode 30). Further, the pressure in the processing space 8 is maintained at a substantially constant value (e.g., 180 mTorr). Accordingly, the front side 11a of the wafer 11 in the area not covered with the passivation films 17a can be exposed to the plasma including radicals and ions produced from $SF_6$ and can be etched off by this plasma. The duration of the etching (i.e., the duration during which the wafer 11 is exposed to the plasma) is set to such an extent that the side wall of each kerf 11d is not too removed. For example, the duration of the etching is preferably set to approximately 6.0 seconds.

In the protective film forming step, $C_4F_8$ is supplied from the $C_4F_8$ source 78 at a predetermined flow rate (e.g., 700 sccm), and a predetermined RF power is applied to the lower electrode 28 and the upper electrode 30 (e.g., 50 W to the lower electrode 28 and 2600 W to the upper electrode 30). Further, the pressure in the processing space 8 is maintained at a substantially constant value (e.g., 60 mTorr). Accordingly, a fluorine-based material can be deposited to the inside surface of each kerf 11d, thereby forming a protective film on the inside surface of each kerf 11d. This protective film formed of a fluorine-based material is resistant to the plasma etching using $SF_6$ or the like to some extent. The duration of the formation of the protective film (i.e., the duration during which the fluorine-based material is deposited) is not especially limited. However, if the protective film is too thick, the protective film formed on the bottom of each kerf 11d cannot be completely removed in the cleaning step. Accordingly, the duration of the deposition of the protective film is preferably set to approximately 2.0 seconds, for example.

In the cleaning step, $SF_6$ is supplied from the $SF_6$ source 76 at a predetermined flow rate (e.g., 1000 sccm), and a predetermined RF power is applied to the lower electrode 28 and the upper electrode 30 (e.g., 250 W to the lower electrode 28 and 2600 W to the upper electrode 30). Further, the pressure in the processing space 8 is maintained at a substantially constant value (e.g., 180 mTorr). By increasing the electric power to be applied to the lower electrode 28, anisotropy in the plasma etching can be enhanced. Accordingly, the protective film formed on the bottom of each kerf 11d can be removed by the plasma including radicals and ions produced from $SF_6$, so that the protective film formed on the side wall of each kerf 11d can be left. As a result, each kerf 11d can be processed in the depth direction in the etching step. The duration of the cleaning is set according to the thickness of the protective film. For example, the duration of the cleaning is preferably set to approximately 1.5 seconds.

When the wafer 11 is divided into individual device chips 25 along the division lines 13 and the upper surface 19a of the die attach film 19 is exposed to the bottom of each kerf 11d, the wafer dividing step is finished. In this wafer dividing step, the plasma is produced by using a fluorine-based gas such as $SF_6$, so that the die attach film 19 is hardly processed.

Figure 5B:
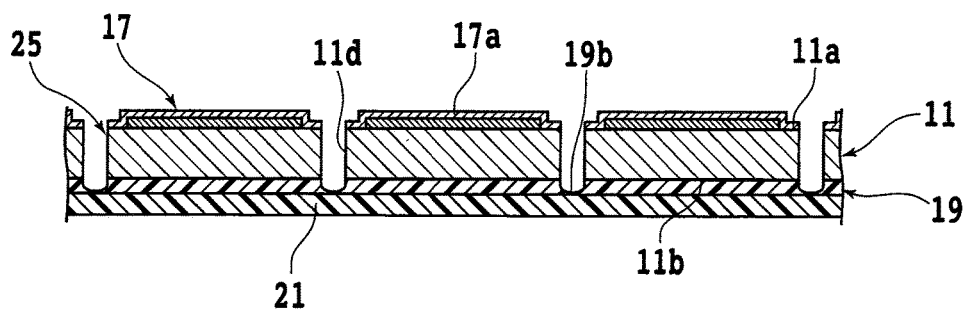
FIG. 5B is a sectional view for illustrating a die attach film removing step.

After performing the wafer dividing step, the die attach film removing step is performed to remove a part or the whole of the die attach film 19 along each division line 13 by performing the plasma etching using an oxygen-based gas. FIG. 5B is a sectional view for illustrating the die attach film removing step.

In the die attach film removing step, $O_2$ (oxygen-based gas) is supplied from the $O_2$ source 80 at a predetermined flow rate (e.g., 200 sccm), and a predetermined RF power is applied to the lower electrode 28 and the upper electrode 30 (e.g., 0 W to the lower electrode 28 and 3500 W to the upper electrode 30). Further, the pressure in the processing space 8 is maintained at a substantially constant value (e.g., 5 mTorr). Accordingly, the die attach film 19 exposed to the bottom of each kerf 11d can be exposed to a plasma including ozone ($O_3$), so that a part or the whole of the die attach film 19 exposed to the bottom of each kerf 11d can be removed by this plasma. In this die attach film removing step, the whole of the die attach film 19 exposed to the bottom of each kerf 11d may be removed to thereby divide the die attach film 19. Alternatively, as shown in FIG. 5B, a part of the die attach film 19 exposed to the bottom of each kerf 11d may be removed to form a recess 19b along each kerf 11d.

In the case that the recess 19b is formed on the die attach film 19 along each kerf 11d in the die attach film removing step as shown in FIG. 5B, a die attach film breaking step is preferably performed to next expand the dicing tape 21, thereby breaking the die attach film 19 along the division lines 13. In this case, the dicing tape 21 must have expandability.

Figure 5C:
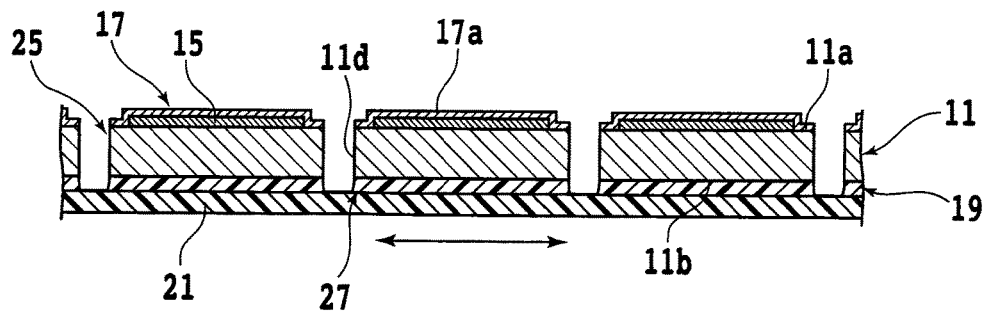
FIG. 5C is a sectional view for illustrating a die attach film breaking step.

FIG. 5C is a sectional view for illustrating the die attach film breaking step. In this die attach film breaking step, the dicing tape 21 is expanded in the radial direction of the wafer 11 to thereby apply a radial force to the die attach film 19. As described above, in this preferred embodiment, the recess 19b is formed on the die attach film 19 along each kerf 11d (i.e., along each division line 13). Accordingly, when the dicing tape 21 is expanded to apply a radial force to the die attach film 19, the die attach film 19 starts to be broken from the recess 19b along each kerf 11d. Thus, the die attach film 19 is divided into individual die attach films 27 along the division lines 13, in which the die attach films 27 each correspond to the respective device chips 25. That is, each die attach film 27 is attached to the back side of the corresponding device chip 25. The passivation films 17a used as a mask in the wafer dividing step and the die attach film removing step are left on the respective device chips 25 to protect the respective devices 15. That is, in this preferred embodiment, each passivation film 17a as a part of the corresponding device chip 25 is used as a mask in the wafer dividing step and the die attach film removing step.

In the device chip manufacturing method according to this preferred embodiment described above, the passivation film 17 formed on the front side 11a of the wafer 11 is removed along each division line 13, and the die attach film 19 is attached to the back side 11b of the wafer 11. Thereafter, the plasma etching using a fluorine-based gas is performed to the front side 11a of the wafer 11 in the condition where the passivation film 17 is used as a mask. Thereafter, the plasma etching using an oxygen-based gas is performed to the front side 11a of the wafer 11 in the condition where the passivation film 17 is used as a mask. Accordingly, it is unnecessary to form a resist mask as used in a conventional method. Further, the plasma etching using a fluorine-based gas is performed to remove the wafer 11 along each division line 13, and the plasma etching using an oxygen-based gas is performed to remove a part of the die attach film 19 along each division line 13. Accordingly, it is unnecessary to perform any separate method for removing the die attach film 19 along each division line 13. Thus, by using the device chip manufacturing method according to this preferred embodiment, each device chip 25 with the die attach film 27 attached thereto can be manufactured at a low cost.

The present invention is not limited to the above preferred embodiment, but various modifications may be made. For example, the thickness of the wafer 11 may be reduced by grinding or the like before performing the wafer supporting step. In this case, the thickness of each device chip 25 can be reduced, and the time required for the wafer dividing step can also be reduced. Further, while the etching step, the protective film forming step, and the cleaning step are repeatedly performed in the wafer dividing step in the above preferred embodiment, the wafer dividing step in the preferred embodiment may include at least the etching step of performing the plasma etching using a fluorine-based gas to thereby divide the wafer 11 along the division lines 13.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device chip manufacturing method for processing a wafer to manufacture a plurality of device chips from the wafer, the wafer having a front side and a plurality of devices formed on the front side so as to be separated by a plurality of crossing division lines, a passivation film being formed on the front side of the wafer so as to cover the plurality of devices, the device chip manufacturing method comprising:

a passivation film removing step of removing the passivation film along each division line;

a wafer supporting step of attaching a die attach film to the back side of said wafer and next attaching a dicing tape mounted on an annular frame to said die attach film to thereby support said wafer through said die attach film and said dicing tape;

a wafer dividing step of performing plasma etching using a fluorine-based gas to the front side of said wafer in the condition where said passivation film is used as a mask after performing said passivation film removing step and said wafer supporting step, thereby dividing said wafer into said individual device chips along said division lines and exposing said die attach film along said division lines; and a die attach film removing step of performing plasma etching using an oxygen-based gas to the front side of said wafer in the condition where said passivation film is used as a mask after performing said wafer dividing step, thereby removing at least part of said die attach film along each division line.

2. The device chip manufacturing method according to claim 1, wherein said passivation film removing step includes the step of applying a laser beam having an absorption wavelength to said wafer along each division line to thereby form a groove on the front side of said wafer along each division line, so that said passivation film is removed along each division line.

3. The device chip manufacturing method according to claim 1, wherein said passivation film removing step includes the step of using a cutting blade to cut said passivation film along each division line, thereby forming a groove on the front side of said wafer along each division line, so that said passivation film is removed along each division line.

4. The device chip manufacturing method according to claim 1, wherein said dicing tape is expandable;

said device chip manufacturing method further comprising a die attach film breaking step of expanding said dicing tape after performing said die attach film removing step, thereby breaking said die attach film along said division lines.

5. The device chip manufacturing method according to claim 1, further comprising a step of forming a groove on the front side of the wafer along each division line, and a protective film forming step that includes forming a protective film on an inside surface of each groove.

6. The device chip manufacturing method according to claim 5, wherein forming said protective film on an inside surface of each groove includes depositing a fluorine-based material on said inside surface of each groove.

7. The device chip manufacturing method according to claim 5, further comprising a cleaning step that includes removing said protective film on a bottom surface of each groove.

* * * * *